United States Patent [19]

Kathirgamanathan

[11] Patent Number: 5,225,110
[45] Date of Patent: Jul. 6, 1993

[54] COATED PARTICULATE METALLIC MATERIALS

[75] Inventor: Poopathy Kathirgamanathan, Middlesex, United Kingdom

[73] Assignee: Cookson Group plc, London, United Kingdom

[21] Appl. No.: 535,057

[22] Filed: Jun. 8, 1990

[30] Foreign Application Priority Data

Jun. 13, 1989 [GB] United Kingdom ............... 8913512

[51] Int. Cl.$^5$ ............................................. H01B 1/06
[52] U.S. Cl. .................................. 252/512; 252/513; 252/514; 252/515
[58] Field of Search ............ 252/512, 513, 514, 515; 428/403, 407

[56] References Cited

U.S. PATENT DOCUMENTS

| 4,665,129 | 5/1987 | Waarman et al. | 252/519 |
| 4,680,236 | 7/1987 | Myers et al. | 252/515 |
| 4,689,250 | 8/1987 | Quella et al. | 252/512 |
| 5,064,469 | 11/1991 | Mack | 252/512 |

FOREIGN PATENT DOCUMENTS

| 0298746 | 1/1989 | European Pat. Off. | 252/500 |
| 2-014258 | 1/1990 | Japan | 252/512 |
| 2-194069 | 7/1990 | Japan | 252/512 |
| 2-194071 | 7/1990 | Japan | 252/512 |
| 2-218757 | 8/1990 | Japan | 252/512 |
| 3-064369 | 3/1991 | Japan | 252/500 |

*Primary Examiner*—Mark L. Bell
*Assistant Examiner*—Anthony J. Green
*Attorney, Agent, or Firm*—Watson, Cole, Grindle & Watson

[57] ABSTRACT

Material which is coated with a coating of an inherently conductive polymeric material. Suitable conductive polymeric materials include polypyrrole, substituted polypyrrole, polyaniline and substituted polyanilines.

The coated powdery or granular metallic material may be used as an EMI and/or RFI shielding material.

7 Claims, 3 Drawing Sheets

COATED PARTICULATE METALLIC MATERIALS

The present invention relates to coated particulate metallic materials and, in particular, to the provision of a conductive polymeric coating on powdery, granular, flaky or fibrous metallic materials.

I have now developed a coated powdery granular, flaky or fibrous metallic material which is coated with a conductive polymeric coating and methods for the preparation of this coated material.

Accordingly, the present invention provides a powdery or granular metallic material which is coated with a coating of an inherently conductive polymeric material.

The term "granular" as used herein is meant to include flaky and fibrous metallic materials, as well as those which would normally be termed granular.

Any powdery or granular metallic material may be used in the present invention provided that it is not pyrophoric, and does not react with the coating material or the ingredients used in the preparation of the coating material. Suitable examples are metals such as iron, aluminium, copper, nickel, silver, gold, platinum, beryllium, cadmium, tin, lead, chromium, zinc, tungsten or alloys such as stainless steel, brass, cobalt/chromium alloys or nickel/iron alloys. The metallic material may be in the form of a powder, granules, flakes or fibres, depending upon the particular source of the material.

The coated powdery granular metallic materials of the present invention may be utilized to produce EMI/RFI shielding objects, for example by being applied onto an article as a coating from a dispersion, or by being compounded with a thermoplastic or thermosetting polymer. An electromagnetic shielding material has to be so chosen to shield both the electrical and magnetic component of electromagnetic waves. In other words, the electrical conductivity, as well as the magnetic permeability have to be matched and their frequency dependence must also be considered. At low frequencies (100 kHz), the magnetic component is important. The ability of a material to cut out the incident electromagnetic radiation by reflection and/or absorption is known as the "shielding effectiveness".

The coated metallic materials of the present invention may also be used in electrically conducting/magnetic inks which can be used for character recognition by either electrical or magnetic means.

The powdery or granular metallic materials which are coated according to the present invention preferably have an average diameter or average length of from 0.1 to 500 micrometres, more preferably 10 to 300 micrometres, with aspect ratios in the range of from 1 to 10000.

The conductive polymeric coating is preferably a coating of a polypyrrole or substituted polypyrrole, a polythiophene or substituted polythiophene, a polyaniline or substituted polyaniline, a polyethylene oxide, an aniline copolymer, a polyphthalocyanine, a polyphenylene, a poly(isothianaphthene) or a polyphenylvinylene.

Examples of substituted polypyrroles which may be used in the invention are those which are disclosed in European Patent Application No. 87306134.5. Examples of substituted polythiophenes which may be used in the invention are disclosed in European Patent Application No. 87306133.7.

Examples of substituted polyanilines which may be used in the present invention are those which comprise repeating units of the general formula:

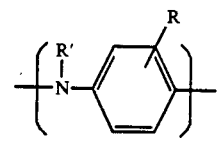

where R is in the ortho- or meta-position and is —$(CH_2)_mO(CHR''CH_2)_nOR'''$ where m is 0 or an integer of from 1 to 6, n is an integer of from 1 to 6, R'' is a hydrogen atom or a methyl group and R''' is an alkyl group containing from 1 to 6 carbon atoms, or the group

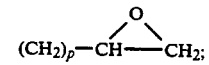

where p is 0 or an integer of from 1 to 6, and R' is hydrogen, $C_{1-6}$ alkyl or aryl, and counterions selected from $Cl^-$, $Br^-$, $SO_4^=$, $BF_4^-$, $PF_6^-$, $H_2PO_3^-$, $H_2PO_4^-$, arylsulphonate, arenedicarboxylate, arenecarboxylate, polystyrene sulphonate, polyacrylate, alkylsulphonate, vinylsulphonate, vinylbenzene sulphonate, cellulose sulphonate, cellulose sulphate or a perfluorinated polyanion.

Examples of aniline copolymers which may be used in the present invention are the copolymers of an aniline monomer of the general formula:

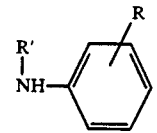

where R is in the ortho- or meta- position and is hydrogen, $C_{1-18}$ alkyl, $C_{1-6}$ alkoxy, amino, chloro, bromo, sulpho, carboxy, hydroxy, sulphonyl, vinyl, or the group

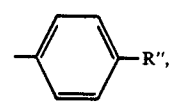

(I)

where
R'' is alkyl or aryl; and
R' is hydrogen, $C_{1-6}$ alkyl or aryl; with another aniline monomer of formula I as defined above, the copolymer including counterions as defined above.

For some particulate materials a combination of coatings may be desirable. Particulate metallic materials which are coated with a combination of coatings, at least one of which is an inherently conductive polymer, are included within the scope of the invention.

The coated metallic materials of the present invention may be prepared by using an electrochemical polymerization method to form the polymeric coating on the metallic material.

Accordingly, the present invention includes within its scope a method for the preparation of a powdery or granular metallic material with a coating of a conductive polymeric material thereon, which method comprises subjecting an appropriate monomer in an aqueous or non-aqueous medium having the powdery or granular metallic material suspended therein to electrochemical oxidation at an electrode potential which is at least as electropositive as the oxidation potential of the monomer.

The metallic materials which are coated with a conductive polymeric material may also be prepared by electrochemical reduction.

By the term "appropriate monomer" as used herein is meant a monomer which can be polymerized to form a conducting polymer.

It will be appreciated by those skilled in the art that the polymers produced by this method include counterions in their structure. When the polymers are produced by electrochemical oxidation the counterions are negatively charged. Suitable counterions, which will generally be provided by an appropriate choice of electrolyte, include chloride, bromide, sulphate, bisulphate, nitrate, tetrafluoroborate, alkylsulphonate, arylsulphonate, arenecarboxylate, alkylcarboxylate, arenedicarboxylate, polystyrenesulphonate, polyacrylate, cellulose sulphonate, cellulose sulphate, anthracenesulphonate, $H_2PO_3^-$, $H_2PO_4^-$, $PF_6^-$, $SbF_6^-$, $AsF_6^-$ or a perfluorinated polyanion.

When the polymers are produced by reduction, then the counterion will be positively charged, e.g. $M^{n+}$ (metal cations), quaternary ammonium salts, etc.

The electrolyte is chosen so as to provide the counterions as above defined.

The non-aqueous medium is preferably acetonitrile, dichloromethane, chloroform, nitromethane, nitrobenzene, propylene carbonate, dichloroethane, N-methylpyrrolidone, sulpholane, dimethylformamide, dimethylsulphoxide, or a mixture of two or more thereof.

The coated metallic materials of the present invention may also be prepared by using a chemical polymerization method to form the polymeric coating on the inorganic material.

Accordingly, the present invention furthermore includes within its scope a method for the preparation of a powdery or granular metallic material with a coating of an inherently conductive polymeric material thereon, which method comprises subjecting an appropriate monomer in an aqueous or non-aqueous medium to oxidation using an oxidant which has a higher oxidation potential than the monomer either in the presence of an acid HX, or a salt thereof to provide the counterions, or with the sequential addition of an acid HX or a salt thereof to the oxidised monomer in order to provide the counterions.

The oxidation may be carried out in the presence or absence of a catalyst. The choice of oxidant will depend upon the monomer which is to be polymerized. Examples of suitable oxidants are $Ag^I$, $Cu^{II}$, $Ce^{IV}$, $Mo^V$, $Ru^{III}$, $Mn^{III}$, $H_2O_2$, $K_2Cr_2O_7$ and $(NH_4)_2S_2O_8$. The preferred oxidants are $K_2Cr_2O_7$, $(NH_4)_2Cr_2O_7$ and $(NH_4)_2S_2O_8$. The catalyst, if used, may be any transition metal ion, preferred examples of which are $Mo^V$, $Ru^{III}$, and $Mn^{III}$.

The metallic materials which are coated with a conductive polymeric material may also be prepared by a chemical reduction method.

The choice of aqueous or non-aqueous medium will depend upon the monomer which is to be oxidised. When the monomer is aniline, or a substituted aniline the polymerization reaction will be carried out in aqueous medium.

In both the chemical and electrochemical coating methods of the invention it is necessary for the powdery or granular metallic material to be maintained in suspension during the coating operation. This may be achieved by any suitable means, for example by vigorous mechanical stirring.

The coated metallic powdery or granular materials of the present invention may be used to produce EMI and/or RFI shielding objects.

The present invention will be further described with reference to the following Examples, in which percentages are by weight unless otherwise stated.

BRIEF DESCRIPTION OF DRAWINGS

The invention is illustrated in the following examples with reference to FIGS. 1 to 3 of the accompanying drawings, in which.

EXAMPLE 1

Preparation of Poly(aniline)-toluenesulohonate Coated Metal Powders

Figure 1:
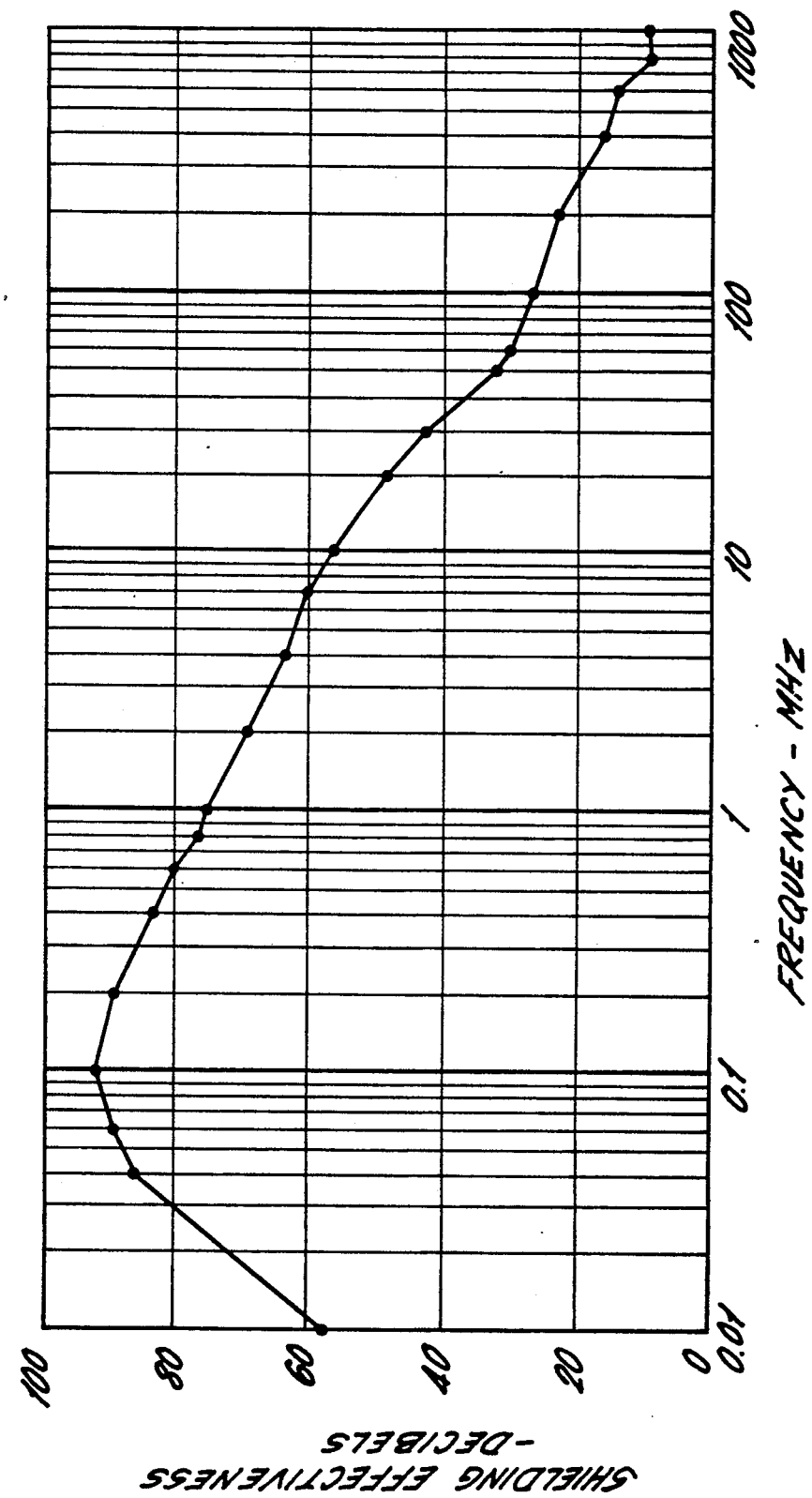
FIG. 1 illustrates the shielding effect of a polymeric composition containing nickel flakes coated with polyaniline in accordance with the invention.

An aniline solution was prepared (233 g in 6.25 liters of deionised water). To this solution, 700 g of nickel or stainless steel flakes were added with vigorous stirring and the stirring continued for a further 20 minutes. An acid solution (480 g of p-toluenesulphonic acid in 2.5 liters of deionised water) was added over 5 minutes, again maintaining vigorous stirring. A solution of ammonium persulphate (570 g in 2 liters of deionised water) was added over a 5 minute period and the resulting reaction mixture was left stirring for a further 3 hours. The solids were then separated by centrifugation and washed with 20 liters of deionised water. The separated solids were then re-slurried in 7 liters of deionised water and spray dried at an inlet temperature of 228°±18° C. and an outlet temperature of 118°±10° C. Typically 900 g of the green coated metal flakes were obtained.

The properties of the coated metal powders produced according to the method are given in Table 1 below.

TABLE 1

| | Poly(aniline) Coated Nickel and Stainless Steel Flakes | | |
|---|---|---|---|
| | Metal Base | | |
| Property | Nickel Flakes | Stainless Steel (fine leafing grade) | Stainless Steel (fine water grade)* |
| Conductivity (S/cm) | 0.52 ± 0.21 [(5.82 ± 0.34)10$^4$] | 0.67 ± 0.02 [(5.00 ± 0.20)10$^4$] | 0.49 ± 0.02 [(5.00 ± 0.20)10$^4$]$^a$ |
| Density (g/cm$^3$) | 3.11 (8.61)$^a$ | 3.49 (7.33)$^a$ | 3.43 (7.43)$^a$ |
| Average Particle Size for SEM (μm) | ~15 (9)$^a$ | ~24 (49)$^{a,b}$ | ~34 (42)$^{a,b}$ |
| Surface Area (m$^2$/g) | 7.12 (0.70)$^a$ | 6.43 (0.49)$^a$ | 6.0 (0.36)$^a$ |

TABLE 1-continued

Poly(aniline) Coated Nickel and Stainless Steel Flakes

| Property | Metal Base | | |
|---|---|---|---|
| | Nickel Flakes | Stainless Steel (fine leafing grade) | Stainless Steel (fine water grade)* |
| Metal Content | Ni = 67.43% | Fe = 48.42% | Fe = 46.66% |

<sup>a</sup>values for the starting metal powders.
<sup>b</sup>reduction in average particle size on coating has been observed.
*recommended for conductive aqueous suspensions Preparation of Poly(pyrrole)p-toluenesulphonate Coated Metal Powders Sodium p-toluenesulphonate was prepared in a liter bucket using 620 g of p-toluenesulphonic acid, 124 g of sodium hydroxide and 2.8 liters of deionised water. 600 g of nickel or stainless steel flakes were added and the mixture stirred vigorously. 360 g of pyrrole were added, and the resulting solution was stirred for a further 15 minutes. At this stage for stainless steel (leafing grade), 3 liters of deionised water were added because the solution was so viscous that the stirring was inefficient. A further ½ liter of deionised water was added. The oxidant (918 g of ammonium persulphate in 3 liters of deionised water) was added over a 5 minute period with vigorous stirring. The reaction mixture was stirred for a further 3 hour period. The solids were then separated by centrifugation and then washed with 20 liters of deionised water. The separated solids were reslurried in 7 liters of deionised water and spray dried at an inlet temperature of 228°±18° C. and an outlet temperature of 118°±10° C. The typical yield was 900 g. The properties of the coated metal powders produced according to this method are given in Table 2 below.

TABLE 2

Poly(pyrrole) Coated Nickel and Stainless Steel Flakes

| Property | Metal Base | | |
|---|---|---|---|
| | Nickel Flakes | Stainless Steel (fine leafing grade) | Stainless Steel (fine water grade)* |
| Conductivity (S/cm) | 0.42 ± 0.02 [(5.82 ± 0.34)10$^4$)$^a$ | 1.79 ± 0.07 [(5.00 ± 0.20)10$^4$]$^a$ | 0.23 ± 0.04 [(5.00 ± 0.20)10$^4$]$^a$ |
| Density (g/cm$^3$) | 2.52 (8.61)$^a$ | 2.89 (7.33)$^a$ | 3.09 (7.43)$^a$ |
| Average Particle Size for SEM (μm) | 14 (9)$^a$ | 35 (49)$^{a,b}$ | 25 (42)$^{a,b}$ |
| Surface Area (m$^2$/g) | 2.80 (0.70)$^a$ | 6.08 (0.49)$^a$ | 5.71 (0.36)$^a$ |
| Metal Content | Ni = 46.52% | Fe = 42.62% | Fe = 39.14% |

<sup>a</sup>values for the uncoated materials.
<sup>b</sup>reduction in average particle size on coating has been observed.
*recommended for conductive aqueous suspensions.

It can be seen from the results given in Tables 1 and 2 that the reduction in conductivity of the pure metal by 10$^5$ fold on coating indicates that the metal powders are reasonably well coated, which has also been confirmed by means of a scanning electron microscope. The lower density of these materials compared to the pure metals is a bonus for many applications where lightweight structures are required. A substantial increase in surface area on coating is also observed.

EXAMPLE 3

Commercial samples of both fine and coarse grade aluminium powder were obtained from BDH. These powders were coated with 10% by weight of polyaniline according to the general procedure of Example 1. The following results were obtained for the coated products:

| Aluminium Powder | Volume Conductivity (S/cm) |
|---|---|
| Coarse Grade | 2.2 |
| Fine Grade | 3 × 10$^{-4}$ to 8 × 10$^{-5}$ |

EXAMPLE 4

Commercial samples of fine grade aluminium powders obtained from BDH, were coated, after treatment with 0.001M sodium hydroxide, with polypyrrole according to the general procedure of Example 2. The following results were obtained for the coated products:

| Aluminium Powder | % Polymer Coating | Volume Conductivity (S/cm) |
|---|---|---|
| Fine Grade | 15% | 5.3 × 10$^{-2}$ |
| Fine Grade | 5% | 3.6 × 10$^{-3}$ |

EXAMPLE 5

Varying proportions of stainless steel flakes and nickel flakes were coated with 10% by weight of polyaniline according to the general procedure of Example 1.

The following results were obtained for the various mixtures:

TABLE 3

| Volume Proportions | | |
|---|---|---|
| Nickel Flakes | Stainless Flakes | Volume Conductivity S/cm |
| 25 | 75 | (2.84 ± 0.66) × 10$^{-1}$ |
| 35 | 65 | (7.97 ± 1.36) × 10$^0$ |
| 45 | 55 | (1.74 ± 1.44) × 10$^1$ |
| 50 | 50 | (2.35 ± 0.01) × 10$^2$ |
| 60 | 40 | (3.48 ± 0.06) × 10$^2$ |
| 70 | 30 | (1.64 ± 0.70) × 10$^3$ |

EXAMPLE 6

Nickel spheres coated with 10% by weight of polyaniline were admixed with carbon black in the ratio of 30:10 and the mixture compounded in an amount of 50% by weight into an ethylene/propylene copolymer containing 8% of ethylene and having a melt index in the range of 2 to 4.

The shielding effectivness of this material was measured using the dual chamber method. A graph of shielding effectivness versus frequency is given in FIG. 1, from which it can be seen that very good sheilding at low frequencies is obtained using this material.

EXAMPLE 7

The shielding effectiveness of the following materials was compared by the dual box method and the transmission line method. In each instance the polymer into which the polymer coated or uncoated metal particles were compounded was an ethylene/propylene copolymer containing 8% of ethylene and having a melt index in the range of 2 to 4. The materials B and C were prepared so as to have the similar conductivities to that of material A.

Material A—uncoated nickel spheres were compounded into the copolymer in an amount of 30% by volume. The resulting composition had a volume conductivity of 0.50 S cm$^{-1}$.

Material B—nickel spheres coated with 10% by weight of polyaniline were compounded into the copolymer in an amount of 7.4% by volume, together with 7.1% by volume of carbon black. The resulting composition had a volume conductivity of 0.60 S cm$^{-1}$.

Material C—a mixture of nickel flakes and stainless steel flakes, in a volume ratio of 60:40, coated with 10% by weight of polyaniline, was compounded into the copolymer in an amount of 7.1% by volume. Carbon black was also compounded into the copolymer in an amount of 7.1% by volume.

Figure 2:
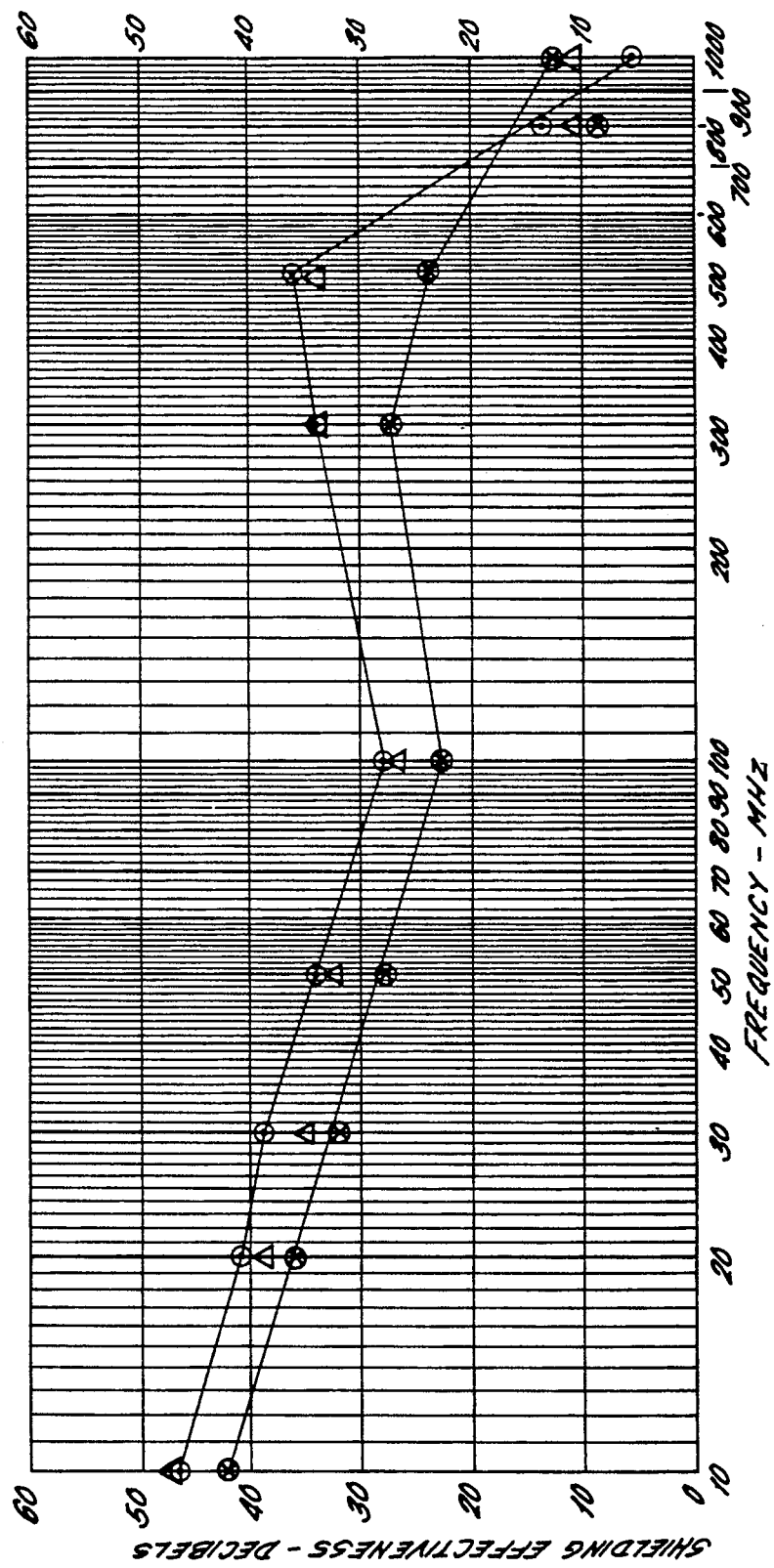
FIGS. 2 and 3 compare the shielding effect of two materials of the invention with the shielding effect of nickel spheres for compositions which have similar volume conductivities.
Figure 3:
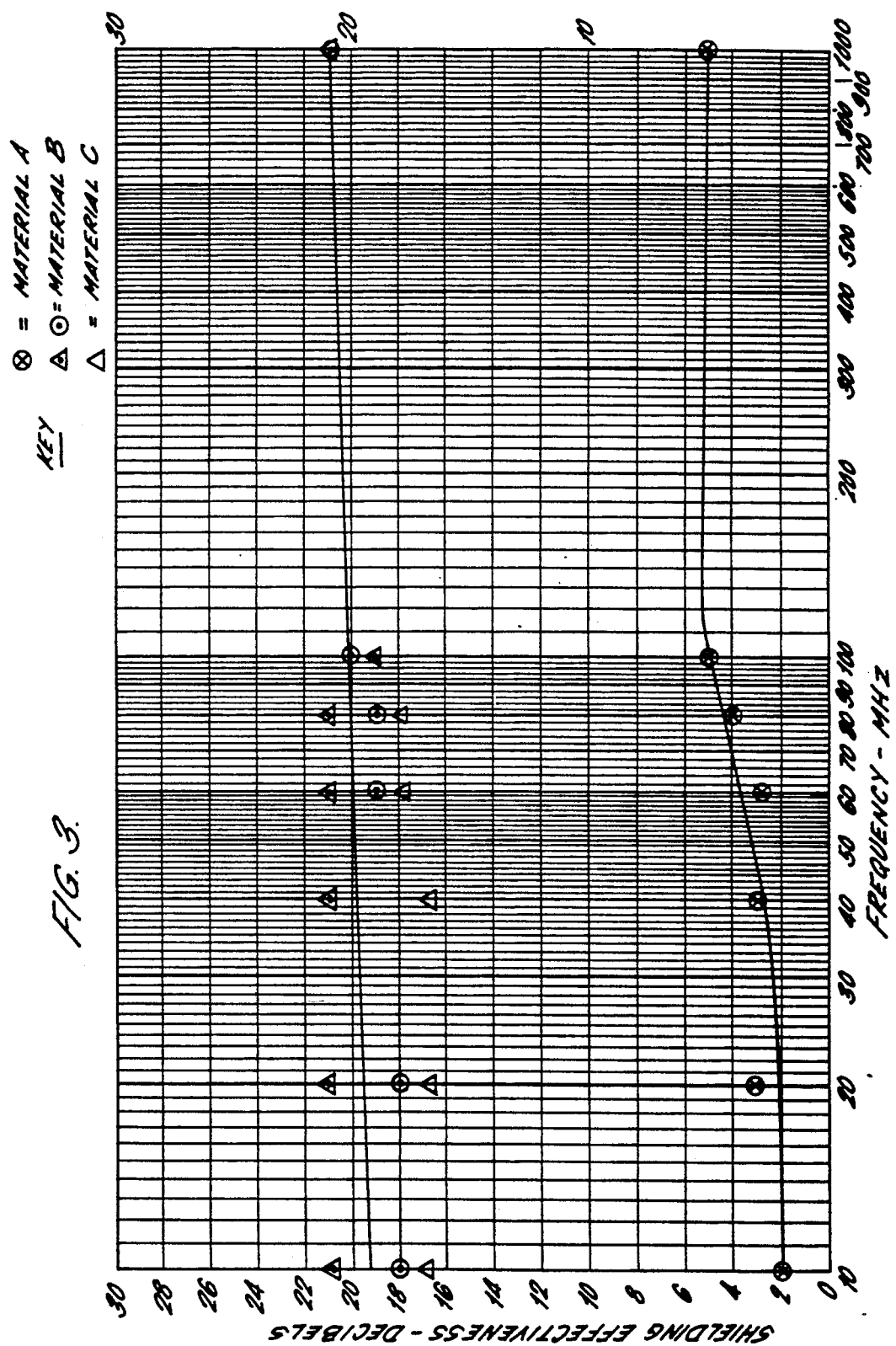

The results obtained from the dual box method are given in FIG. 2, whilst those from the transmission line method are given in FIG. 3. The difference in shielding effect as shown in FIGS. 2 and 3 for the various materials is attributed mainly to the different methods used for measurement. Using the dual box method (FIG. 2) the electric component of the electromagnetic waves is the component which is primarily measured, whereas using the transmission line method both the magnetic and electric components of the electromagnetic waves are measured to the same level.

I claim:

1. A metallic material selected from the group consisting of powdery and granular metallic materials, which is coated with a coating of a polymeric material which is electrically conductive.

2. Material according to claim 1 wherein the electrically conductive polymeric material is selected from the group consisting of a polypyrrole, a substituted polypyrrole, a polythiophene, a substituted polythiophene, a polyaniline, a substituted polyaniline, a polyethylene oxide, an aniline copolymer, a polyphthalocyanine, a polyphenylene, a poly(isothianaphthene) and a polyphenylvinylene.

3. Material according to claim 1 wherein the metallic material is selected from the group consisting of iron, aluminium, copper, nickel, silver, gold, platinum, beryllium, cadmium, tin, lead, chromium, zinc, tungsten, stainless steel, brass, a cobalt/chromium alloy and a nickel/iron alloy.

4. Material according to claim 1 which has an average diameter or average length in the range of from 0.1 to 500 micrometers, prior to coating with the conductive polymeric material.

5. A particulate product comprising particles of non-pyrophoric metallic material coated with a polymeric material consisting of an electrically conductive polymer.

6. A particulate product according to claim 5, wherein said metallic material is selected from the group consisting of iron, aluminum, copper, nickel, silver, gold, platinum, beryllium, cadmium, tin, lead, chromium, zinc, tungsten, stainless steel, brass, a cobalt/chromium alloy and a nickel/iron alloy.

7. A particulate product according to claim 6, wherein said polymeric material is selected from the group consisting of a polypyrrole, a substituted polypyrrole, a polythiophene, a substituted polythiophene, a polyaniline, a substituted polyaniline, a polyethylene oxide, an aniline copolymer, a polyphthalocyanine, a polyphenylene, a poly (isothianaphthene) and a polyphenylvinylene.

* * * * *